United States Patent [19]
Cranford, Jr. et al.

[11] Patent Number: 5,731,737
[45] Date of Patent: Mar. 24, 1998

[54] METHOD AND APPARATUS FOR REDUCING CLOCK SWITCHING NOISE IN CONTINUOUS TIME FILTERS

[75] Inventors: Hayden Clay Cranford, Jr., Apex; Scott David Huss, Raleigh, both of N.C.

[73] Assignee: International Business Machines Corporation, Armonk, N.Y.

[21] Appl. No.: 632,976

[22] Filed: Apr. 16, 1996

[51] Int. Cl.[6] .................................. H03K 5/00; H03B 1/00
[52] U.S. Cl. ........................... 327/553; 327/94; 327/552; 330/107
[58] Field of Search .............................. 327/91, 94, 552, 327/553, 554; 330/305, 109, 294, 107

[56] References Cited

U.S. PATENT DOCUMENTS

| | | | |
|---|---|---|---|
| 3,644,847 | 2/1972 | Neuman | 333/17.1 |
| 4,322,697 | 3/1982 | Carbrey | 333/173 |
| 4,349,916 | 9/1982 | Roeder | 375/103 |
| 4,987,373 | 1/1991 | Soo | 327/145 |
| 5,239,367 | 8/1993 | Sato | 358/21 R |
| 5,471,168 | 11/1995 | Hans et al. | 327/553 |

OTHER PUBLICATIONS

Continuous-Time Integrated Filters—A Tutorial, R. Schaumann IEEE Proceedings, vol. 136, pp. 184–190, Aug. 1989.
Design Considerations for High Frequency Continuous–Time Filters and Implementation of an Antialiasing Filter for Digital Video, Gopinathan et al, IEEE J. Solid–State Circuits, Vol. SC–25, No. 6, pp. 1368–1378, Dec. 1990.
Design of a 15-MHZ CMOS Continuous-Time Filter with on-Chip Tuning, J.M. Khoury, IEEE J. Solid–State Circuits Vol. SC–26, no. 12, pp. 1988–1977 Dec. 1991.
The Problem of On–Chip Automatic Tuning in Continuous–Time Integrated Filters, Schaumann & Tan, IEEE Proc. ISCAS, pp. 106–109, 1989.

Primary Examiner—Timothy P. Callahan
Assistant Examiner—Dinh T. Le
Attorney, Agent, or Firm—Steven B. Phillips; Kelly K. Kordzik

[57] ABSTRACT

A method and apparatus for reducing reference frequency signal and/or clock switching noise in self-tuned integrated continuous-time filters. In the master-slave automatic tuning scheme, one or more sample-and-hold circuits sample and hold the frequency control signal and Q-control signal generated by the feedback loop(s) of the automatic tuning system. The control signals are held at a constant level for a period of time during which the reference frequency signal and/or clock signal are quiescent. At one or more predetermined times, the frequency control and Q-control signals are intermittently updated to automatically tune the slave filter.

20 Claims, 2 Drawing Sheets

METHOD AND APPARATUS FOR REDUCING CLOCK SWITCHING NOISE IN CONTINUOUS TIME FILTERS

TECHNICAL FIELD OF THE INVENTION

The present invention relates to integrated continuous time filters and, in particular, to an apparatus and method for reducing noise in integrated continuous time filters.

BACKGROUND OF THE INVENTION

Conventional analog filters are generally composed of discrete elements, including resistors, capacitors and inductors. It is well-known how to design passive LC networks or active RC circuits to derive a given transfer function. In order to contain costs and reduce complexity, as well as size, techniques have been developed to integrate complex analog filter functions on semiconductor chips. Such filters are commonly referred to as integrated continuous-time filters. Integrated continuous-time filters are typically comprised of active elements (e.g. operational amplifiers, operational transconductance amplifiers, transconductors, etc.) and resistors and capacitors, usually configured in an RC feedback network.

In order to provide operation of an integrated filter within the required frequency parameters, very accurate absolute values of resistors, transconductors and capacitors must be realized and maintained. However, integration of such components on a chip produces components having large tolerances. Although integrated circuit (IC) processing reliably realizes accurate ratios of like components on a chip, processing tolerances of absolute values of resistors, capacitors and transistor parameters are generally of the order of 20 to 50 percent. As such, the magnitudes of these tolerances are too large for a filter to perform within specifications.

In response to this detriment, designers have developed an automatic tuning scheme as part of the integrated filter system. Continuous-time filter design techniques have been developed to compensate for semiconductor process variations by "locking" the filter response to a reference frequency. These filters usually compensate for process tolerances by placing a "master" in an automatic tuning loop to help tune the actual filter, referred to as the "slave" filter. In most designs, the master is either (1) a replica of the slave filter (or sub-portion thereof) or (2) includes similar circuitry of the slave filter, with both (1) and (2) including circuitry that models the behavior of the slave filter. Generally, automatic tuning of an integrated continuous-time filter includes measuring filter performance, comparing it with a standard, calculating the error, and applying a correction to the filter system to reduce the error. In almost all systems, an accurate reference frequency (e.g. derived from the system clock or an external source) is used as the standard. From the response of the master's output compared with the reference frequency, automatic tuning of the slave filter is accomplished.

Now referring to FIG. 1, there is illustrated a block diagram of a prior art automatic tuning scheme of an integrated continuous-time filter. The slave filter (main filter) performs the signal processing of the desired signal. As will be appreciated, and in most cases, the master comprises either (1) a voltage-controlled filter or (2) a voltage-controlled oscillator. As is well known in the art, the circuitry of the master is designed to be of sufficient complexity to model the slave filter's behavior that is relevant to tuning. Both the master and the slave filter are constructed on the same IC such that the master models with adequate accuracy all relevant performance criteria of the slave filter. In the automatic tuning, the reference signal is applied both to the master and to the tuning circuitry (if the master includes a voltage-controlled filter (VCF)), or only to the tuning circuitry (if the master is a voltage-controlled oscillator (VCO)). The tuning scheme relies on matching and tracking of the components of the master and slave filter to tune the slave filter. A correction voltage generated by the tuning circuitry is applied to the slave filter, as well as the master, to perform the tuning.

In the master-slave tuning system utilizing a VCF, the reference frequency signal is applied to both the master (VCF) and a frequency control circuit. The output of the master is also input to the frequency control circuit. The frequency control circuit detects phase errors in the master filter's response to the reference frequency signal. The purpose of the frequency control circuit is to control the frequency parameters (e.g., center frequency, frequency cutoff, etc.) of the slave filter (and the master filter).

In the master-slave tuning system utilizing a VCO, the master (VCO) output is applied to a frequency control circuit. The reference frequency signal is also input to the frequency control circuit. The frequency control circuit detects frequency errors between the master output and the reference frequency signal. The purpose of the frequency control circuit is to control the frequency parameters (e.g., center frequency, frequency cutoff, etc.) of the slave filter (and the master output). When the master comprises a VCO, the VCO typically uses circuitry that is similar to the slave filter circuitry (i.e. similar transconductance amplifiers). The term "frequency control circuit" as used herein denotes a frequency control circuit that detects frequency or phase errors depending on the type of master used and/or the performance desired of the frequency control circuit.

As will be appreciated, any circuitry, configuration, or means that perform the overall function of the master (and tuning circuit) may be used. The master coupled with the frequency control circuit provide a feedback system that forms a phase-locked loop (PLL) or a frequency-locked loop (FLL), with the frequency control circuit usually including a phase or frequency detector and low pass filter (LPF) (in addition, other types of feedback systems may be used). The frequency control voltage (Vfreq) is applied to both the slave filter and the master such that any detected errors are minimized. Since the master and slave filter are on the same IC, errors in the slave filter are assumed to match and track those of the master. In addition to correcting (tuning) any frequency errors in the slave filter, a Q-control circuit may be provided to tune the shape of the slave filter's transfer function (Q parameter; $jQ=(1/R) \sqrt{(L/C)}$). Generally, the Q-control circuit includes a peak detector and low pass filter. When using a VCF, the reference frequency signal is applied to the master, with the output thereof applied to the Q-control circuit along with the reference frequency signal. When using a VCO, the reference frequency signal and the VCO output are applied to the Q-control circuit. The master coupled with the Q-control circuit provides a feedback system that forms an amplitude-locked loop (ALL). The ALL detects any changes in the gain at pole frequency from the ideal value and tunes them out using the Q-control voltage (Vq) generated by the Q-control circuit.

It will be understood that the configuration shown in FIG. 1 corresponds to a self-tuned integrated filter scheme using a voltage-controlled filter as the master. If a voltage-controlled oscillator scheme is used, the reference frequency signal will, in most cases, not be an input to the master.

The design of the frequency control circuit and the Q-control circuit shown in FIG. 1 are well known in the art and therefore, further discussion and description of the frequency control circuit and the Q-control circuit is not generally needed for understanding the present invention. As will be appreciated by one skilled in the art, there may be many circuits, configurations and the like for providing the functions of the frequency control circuit and Q-control circuit as shown in FIG. 1. Almost all prior automatic tuning schemes perform similarly, with actual implementation being circuit-specific, depending on technology, type of circuit, type of tunable elements, etc.

The problem with these prior art integrated continuous-time filters with automatic tuning is that the filter suffers from unwanted coupling of the reference frequency signal and/or oscillator signals (i.e., clock signals) into the filter passband. This causes undesirable noise and further may modulate the frequency response of the filter causing distortion of the filter's response. The unwanted coupling of frequency signals decreases the signal-to-noise ratio of the filter and may even cause a catastrophic failure of the filter if the magnitude of the clock noise coupling is sufficient. In an effort to prevent the unwanted coupling of the clock signals and clock noise, designers have focused on the physical layout of the circuits and/or have limited the signal swing to limit the coupling of the signal into areas of the circuit design. In addition, the use of reference frequency signals or clocks at very high speed (two to ten times the filter frequency) to avoid the noise coupling in the filter passband have been proposed, however, this is unacceptable because the overall function of the tuning circuit is to tune the parameters of the filter in the same frequency range as the passband of the filter.

Accordingly, there exists a need for a method and apparatus for reducing reference frequency signal noise or clock switching noise in integrated continuous-time filters. Further, there is needed an integrated continuous-time filter that reduces unwanted coupling of signals and signal noise into the filter passband. Also, there is needed a method and apparatus that is capable of holding filter characteristics (frequency and Q) for periods of time, as well as providing for independent (external to the filter) adjustment of filter characteristics (frequency and Q) of an integrated filter.

SUMMARY OF THE INVENTION

According to the present invention, there is provided an apparatus and method for reducing reference frequency or clock noise feedthrough in a tunable integrated continuous time filter. The integrated continuous time filter includes a tunable integrated slave filter for processing the desired signal and an integrated master modeling the slave filter's behavior and outputting a first reference signal A frequency control circuit receives the first reference signal and a second reference signal and generates a master frequency control signal relating to the difference in phase between the first reference signal and the second reference signal. A sample and hold circuit receives and samples the master frequency control signal and outputs a frequency control signal during a time period when the second reference signal is quiescent. The frequency control signal is input to the slave filter and controls filter frequency characteristics of the slave filter.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is made to the following description taken in conjunction with the accompanying drawings, wherein.

DETAILED DESCRIPTION OF THE INVENTION

Figure 1:
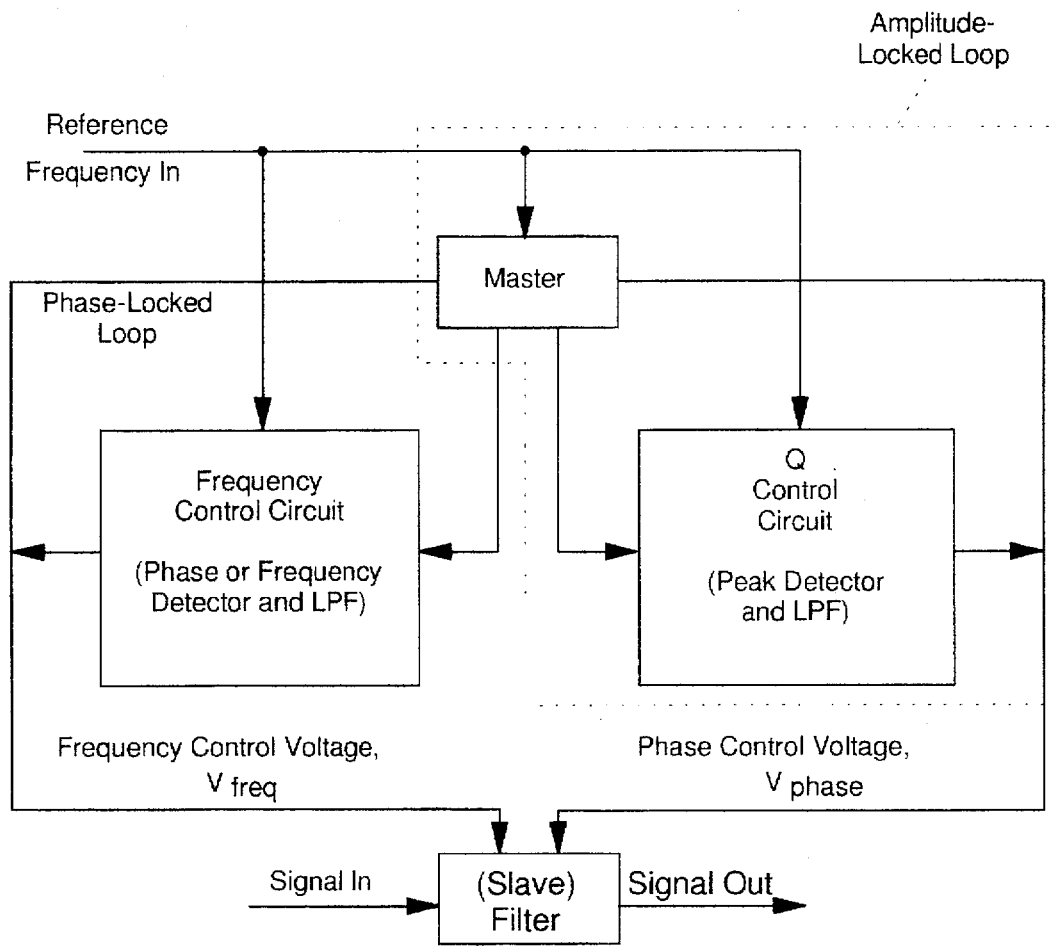
FIG. 1 illustrates a prior art self-tuned integrated continuous-time filter.

With reference to the drawings, like reference characters designate like or similar parts throughout the drawings.

Figure 2:
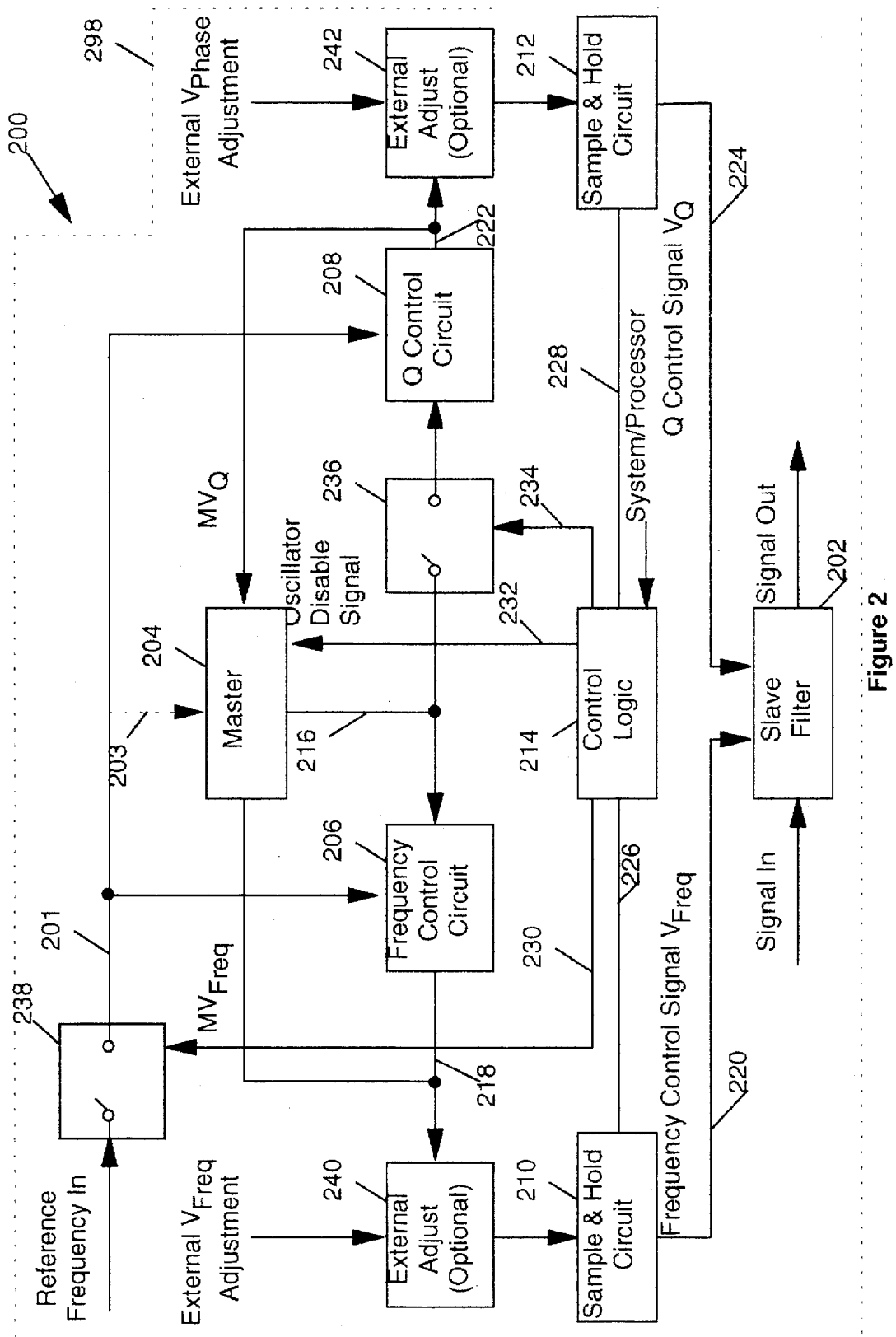
FIG. 2 illustrates a self-tuned integrated continuous-time filter in accordance with the present invention.

Now referring to FIG. 2, there is illustrated a block diagram of an integrated continuous-time filter 200 in accordance with the present invention. The filter 200 is manufactured on an integrated circuit (IC) 298. The major elements of the filter 200 include a slave filter 202, a master 204, a frequency control circuit 206, a Q-control circuit 208, a first sample-and-hold circuit 210 and a second sample-and-hold circuit 212. As such, the slave filter 202 and the master 204 are constructed on the same substrate. As will be appreciated, the Q-control circuit 208 and the second sample-and-hold circuit 212 are optional and may be used in applications where Q-parameter filter characteristics of the slave filter are desired to be controlled.

The slave filter 202 is a tunable integrated filter, typically comprised of resistors, capacitors and/or transconductance amplifiers. The slave filter 202 receives a desired signal (labeled as "Signal In "3), processes (filters) the desired signal and outputs the desired filtered signal (labeled as "Signal Out "). The filter response characteristics of the slave filter 202 are tunable using a frequency control signal 220, also identified as Vfreq, and a Q-control signal 224, also identified as Vq. The frequency control signal 220 generally controls or tunes filter frequency parameters of the slave filter 202 while the Q-control signal 224 generally controls or tunes the Q-parameters of the slave filter 202.

A reference frequency signal 201 is applied to the frequency control circuit 206 and the Q-control circuit 208. The master 204 generates a reference signal 216 that is also applied to the frequency control circuit 206 and the Q-control circuit 208. In the configuration shown in FIG. 2, the master 204 consists of a voltage-controlled oscillator (VCO) that is constructed based on a subsection of the slave filter's circuitry and/or includes circuitry similar to the slave filter's circuitry. The circuitry of the master 204 is designed to be of sufficient complexity to model the slave filter's behavior that is relevant for tuning. The master 204 and the slave filter 202 are constructed on the same IC so that the master 204 models with adequate accuracy all relevant performance criteria of the slave filter 202. Automatic tuning of the slave filter 202 relies on matching and tracking of the components of the master 202 and the slave filter 204.

Figure 3:
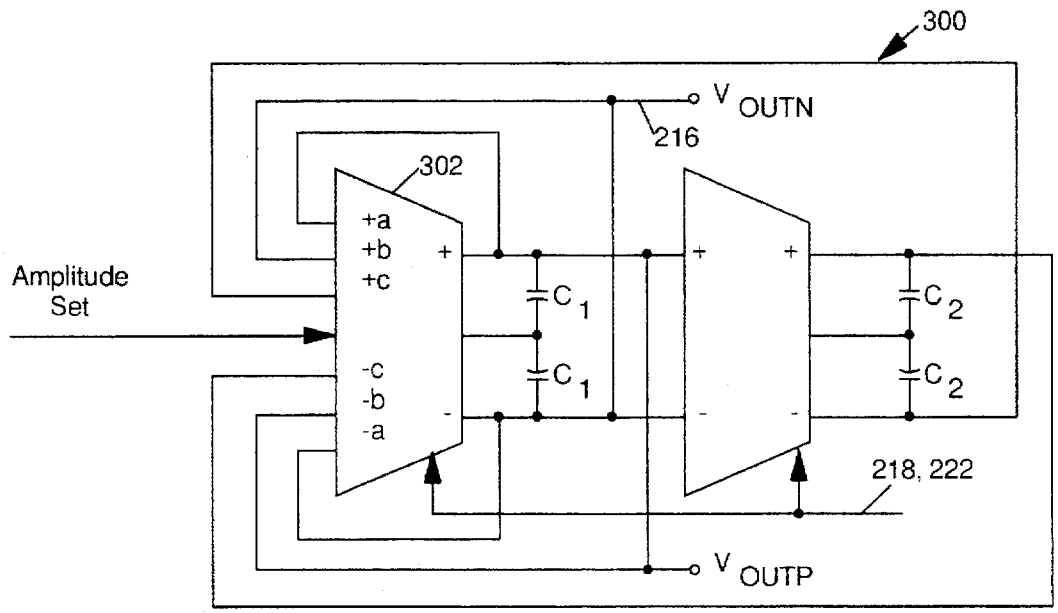
FIG. 3 illustrates a block diagram of one possible implementation of a voltage-controlled oscillator master in accordance with the present invention.

Now referring to FIG. 3, there is illustrated a block diagram of one possible implementation of a voltage-controlled oscillator (VCO) master 300 that may be used in the present invention. The VCO master 300 includes a differential three-input transconductance amplifier 302 and a differential transconductance amplifier 304. The a and b inputs provide positive and negative feedback from the oscillator outputs Voutp and Voutn. The differential output of the transconductance amplifier 302 is input to the transconductance amplifier 304 with the output thereof providing positive and negative feedback to the a and b inputs, respectively, of the transconductance amplifier 302 to stabilize the amplitude of oscillation. The master frequency control signal (MVfreq) 218 and master Q-control signal (MVq) 222 output from the frequency control circuit 206 and the Q-control circuit 208, respectively, (shown in FIG. 2) are input to the master 300 to control or tune the frequency of oscillation of the master 300. Capacitors C1 and C2 are included as illustrated in FIG. 3 to provide the desired frequency range of the master 300. The signals Voutp and Voutn are the reference signal 216 shown in FIG. 2. As will be appreciated, the master 300 can implemented using either single-ended or differential signals.

The master 200, 300 consists of any subsection of the slave filter's 202 circuitry (up to a full duplicate of the slave filter 202) of sufficient complexity to model the slave filter's behavior that is relevant for tuning. It will be understood, that a duplicate of the transconductance amplifier 302 or the transconductance amplifier 304, or both, of the master 300 may constitute a part of the slave filter 202. Alternatively, one or more transconductance amplifiers having similar circuitry that is in the slave filter 202 and that is of sufficient similarity and complexity to model the slave filter's 202 behavior may be used in the master 200, 300.

The reference frequency signal 201 and the reference signal 216 are both applied to the frequency control circuit 206. The frequency control circuit 206 detects any frequency or phase differences between the reference frequency signal 201 and the reference signal 216 and generates the master frequency control signal 218 (MVfreq). The master frequency control signal 218 is applied to the master 204 in a feedback loop (phase-locked loop or frequency-locked loop and the like) so that any errors can be minimized. The master frequency control signal 218 is also applied to the slave filter 202, via frequency control signal 220 (Vfreq), to control the filter frequency parameters of the slave filter 202. Since the components of the master 202 and the slave filter 204 are constructed to correspond (match), the errors in the slave filter 204 can be assumed to match and track those of the master 204. Typically, such errors are caused by IC process variations (tolerances), power supply variations, operating temperature variations and aging.

Similarly, the reference frequency signal 201 and the reference signal 216 are both applied to the Q-control circuit 208. The Q-control circuit 208 detects any differences in amplitude between the reference frequency signal 201 and the reference signal 216 and generates the master Q-control signal 222 (MVq). The master Q-control signal 222 is applied to the master 204 in a feedback loop (amplitude-locked loop) so that any errors can be minimized. The master Q-control signal 222 is also applied to the slave filter 202, via Q-control signal 224 (Vq), to control the filter Q-parameters of the slave filter 202. As will be appreciated, the Q-control circuit and feedback system is optional, and may be used in certain applications when the filter Q-parameters of the slave filter 202 are desired to be controlled or tuned.

It will be understood by one skilled in the art that the master 204 may, instead of consisting of a VCO, consist of a voltage-controlled filter (VCF). If a VCF is used, the reference frequency signal 201 is additionally applied to the master 204, as shown by the dotted signal line 203, with the output reference signal 216 thereof applied to the frequency control circuit 206 and the Q-control circuit 208. In this particular embodiment, the master 204 will consist of a master filter that may be a duplicate of the slave filter 202 or may include only a subsection of the slave filter 202 sufficient to model the response behavior of the slave filter 202. As will be appreciated, different types circuits may be used for the master 204 and the loop feedback circuitry. Any elements or components may be used that provide the function of the master-slave tuning scheme in providing a frequency control signal (and a Q-control signal if desired) for tuning the slave filter 202.

The master frequency control signal 218 is applied to a sample-and-hold circuit 210. The sample-and-hold circuit 210 functions to sample and hold the master frequency control signal 218 in response to a hold signal 226 generated by a control logic circuit 214. The sample-and-hold circuit 210 samples and holds the master frequency control signal 218 and outputs the frequency control signal 220 (Vfreq) for input to the slave filter 202.

Similarly, the master Q-control signal 222 is applied to a sample-and-hold circuit 212. The sample-and-hold circuit 212 functions to sample and hold the master Q-control signal 222 in response to a hold signal 228 generated by the control circuit 214. The sample-and-hold circuit 212 samples and holds the master Q-control signal 222 and outputs the Q-control signal 224 (Vq) for input to the slave filter 202.

In the filter 200 shown in FIG. 2, the sample-and-hold circuits 210, 212 hold a constant signal level until the next updates to the frequency control signal 220 and the Q-control signal 224 are activated by the control circuit 214 by the hold signals 226, 228.

The first step in tuning or converging the filter 200 is initiated by the closing of the switches 236, 238 and enabling the master (VCO) 204. One of several ways may be used to determine completion of the step of tuning (converging) the filter 200. One way is to tune the filter 200 for a predetermined time interval using a timer. Another way is to sense the change or rate of change of the master frequency control signal 218 as the filter 200 is being tuned (converged). After the time interval has elapsed or upon the sensing of a change or rate of change that is substantially small, the sample-and-hold circuits 210, 212 are activated, the switches 236, 238 are opened, and the master (VCO) 204 is disabled.

Once the filter 200 has been tuned or converged (sample-and-hold circuits activated, switches opened and master disabled), the tuned filter 200 is in a tuned mode until it is desired to tune (or re-tune) the filter 200 (i.e. repeating the tuning or converging process). A second timer, or a signal from the system in which the filter 200 is used, can be used to determine when the tuning or converging process should be performed (or repeated). After the time interval has elapsed or in response to a signal from the system, the switches 236, 238 are closed and the master (VCO) 204 is enabled, thus initiating the tuning process.

As will be appreciated, a person skilled in the art will be able to design the control logic 214 to perform the desired function in accordance with the present invention. More sophisticated control logic may be used depending on the specific operation and functioning of the control logic 214. In one way, the control logic 214 may be integrated with circuits and/or respond to signals from another system. In addition, the control circuit 214 may be comprised of logic elements that generate the appropriate outputs in response to instructions from a processor (not shown). Alternatively, the control circuit 214 may include a processor.

As will be appreciated, the sample-and-hold circuits 210, 212 are constructed to include any circuit or means (including software) for sampling and holding a signal. The sample-and-hold circuits may be very simple to very complex. Examples of sample-and-hold circuits include amplifiers with switches and storage capacitors that utilize feedback to hold the signal level, and the like, and an analog-to-digital (A/D) converter, data storage latches, digital-to-analog (D/A) converter and clocking and control logic, and the like. The type and complexity of design for the sample-and-hold circuits 210, 212 will most likely depend on the length of time the signal is desired to be held, and will also depend on costs and accuracy. Any circuit or means may be used to provide the function of sampling and holding a signal.

In operation, the filter 200 is first converged by enabling a switch 238, via an enable/disable signal 230 generated by the control circuit 214. This applies the reference signal 201 to the frequency control circuit 206 and the Q-control circuit 208 (and to the master 202 as well, if the master 202 is comprised of a voltage-controlled filter). Convergence is defined as the running (operation) of the oscillator and the reference signal 201 (if a VCO is used) or the running of the reference signal 201 (if no VCO is used) until the "locking" of the phase lock loop and/or the amplitude lock loop. In addition, an enable/disable signal 232 generated by the control circuit 214 is set enabling the voltage-controlled oscillator to begin running. Meanwhile, the sample-and-hold circuits 210, 212 are not in a hold state, unless the filter is running an update cycle to the control voltages 220, 224 and if so, then the sample-and-hold circuits 210, 212 are holding the previous value of the control voltages 220, 224.

The reference frequency signal 201 and the reference signal 216 are input to the frequency control circuit 206 to lock the master 204 to the intended frequency. Simultaneously, the reference frequency signal 201 and the reference signal 216 are input to the Q-control circuit 208 to lock the master 204 to the intended phase. As will be appreciated, an optional switch 236 controlled by a signal 234 may be provided to allow the frequency control circuit 206 to tune the frequency parameters prior to tuning of the Q-parameters of the filter transfer function. In this case, the switch 236 will be closed after a sufficient amount of time has elapsed to allow the frequency control signal 218, 220 to reach the desired tuning value. And then Q-control circuit 208 would operate to generate the tuning Q-control signal 222, 224.

When the next updates to the frequency control signal 220 and the Q-control signal 224 are desired (after sufficient time for convergence, sufficient time for the phase lock loop and/or amplitude lock loop to "lock"), the sample-and-hold circuits 210, 212 are enabled or placed in the "hold" state, via signals 226, 228. Simultaneously with the sampling and holding of the sample-and-hold circuits 210, 212, or shortly thereafter, the signal 232 is activated thereby disabling the oscillator of the master 204, thus halting the reference signal 216 output from the master 204 (stopping the oscillator oscillating).

In addition, the enable/disable signal 226 is activated to disable the reference frequency signal 201. It will be understood that the switch 238 may include any means to disable the source of, or stop the reference frequency signal 201. The source of the reference frequency signal 201 may be located on the same IC chip (near the filter 200 or from another system on the IC chip) or may be derived from an external source. As such, the switch 238 will provide a means for disabling the reference frequency signal 201 or its source, so as to eliminate any injection of noise into the filter 200 caused by the operation of the reference frequency signal 201. Disabling the reference signals reduces or eliminates reference frequency feedthrough to the passband of the slave filter 202. This increases signal-to-noise ratio of the slave filter 202 and gives the filter 202 a more accurate alter response.

After the sample-and-hold circuits 210, 212 are placed in the hold mode, the frequency control signal 220 and the Q-control signal 224 remain substantially constant until the next time the filter 200 convergence sequence is activated. The slave filter 202 is now "locked" to a specific frequency response (and Q) and the reference signal(s) 201, 216 are deactivated thus minimizing the possibility of reference signal feedthrough while maintaining good filter matching.

In many applications, constant filter update is not required since the applications are not continuously functioning. The present invention can take advantage of the "downtime" (i.e. between transmitting and receiving in the case of telecommunications systems) and activate the reference signal(s) thereby re-adjusting the filter characteristic as needed (i.e. intermittently updating). Reference signal noise will be prevented from interfering with the filter response since during the time that the filter is passing a signal, the reference signal(s) are quiescent. As set forth, the filter 200 of the present invention may be operated in the non-continuous mode (the desired signal is not continuously passing through the filter) or in the continuous mode (the desired signal in continuously passing through the filter).

Several considerations must be analyzed for choosing the frequency of operation of the reference signal(s). In analyzing the prior art filter as shown in FIG. 1, if the reference frequency is in the stopband, the feedthrough is at minimum, but the master to slave filter matching is poor. Placing the reference frequency near the passband edge, and in close proximity to the unity-gain frequencies of the slave filter, results in good master to slave filter matching but increases reference frequency feedthrough problems. When the reference frequency is placed in the passband, but away from the passband edge, master to slave filter matching is increased yet frequency feedthrough is also increased. In the present invention, if operation is in the continuous mode (continuous signal, intermittent updates to the filter characteristics), it may be more advantageous to operate the reference frequency(s) near the passband edge. If operating in the non-continuous mode (non-continuous signal, intermittent updates to the filter characteristic occurring during the "downtime" of the signal), it may be more advantageous to operate the reference frequency(s) in the passband, since the present invention is intended to disable the reference frequency(s) and eliminate any reference frequency feedthrough during predetermined time periods.

In another aspect of the present invention, an optional external adjustment circuit 240 is inserted in the signal path of the frequency control signal 220 somewhere between the output of the frequency control circuit 206 and the input to the slave filter 202. Another optional external adjustment circuit 242 is inserted in the signal path of the Q-control signal 224 somewhere between the output of the Q-control circuit 208 and the input to the slave filter 202. These provide for external adjustment of the frequency control signal 220 and/or the Q-control signal 224. The adjustment circuits 240, 242 may simply be DC amplification or attenuation circuits (or simply summers or subtractors) that adjust the frequency control signal 220 and/or the Q-control signal 224 to some percentage of its value based on input from another part of the system or externally. This also allows measurements of system parameters to be used to adjust the control signals 220, 224. Also, independent adjustment of the Vfreq and Vq signals is realized. It will be appreciated that many various ways and means may be designed to provide the functions of the frequency control circuit and the Q-control circuit, and as such, the use of any type of hardware and/or software is not intended to limit in any way the present invention. Although the present invention and its advantages have been described in the foregoing detailed description and illustrated in the accompanying drawings, it will be understood by those skilled in the art that the invention is not limited to the embodiment(s) disclosed but is capable of numerous rearrangements, substitutions and modifications without departing from the spirit and scope of the invention as defined by the appended claims.

What is claimed is:

1. A self-tuned filter integrated on a chip comprising:
  a first tunable integrated filter;
  means for generating a frequency control signal in response to a first reference signal;
  first means for sampling and holding at one or more predetermined times said frequency control signal and outputting said frequency control signal during a time period when said first reference signal is quiescent, said frequency control signal tuning frequency characteristics of said first tunable integrated filter.

2. The filter in accordance with claim 1 wherein said means for generating said frequency control signal comprises:
  a master generating a second reference signal and substantially modeling performance criteria of said first tunable integrated filter; and
  a frequency control circuit receiving said first reference signal and said second reference signal and generating said frequency control signal.

3. The filter in accordance with claim 2 wherein said first means for sampling and holding comprises a first sample-and-hold circuit for sampling and holding said frequency control signal in response to a hold signal.

4. The filter in accordance with claim 3 further comprising means for disabling said first reference signal during said time period in response to a disable signal to reduce noise feedthrough from said first reference signal to said tunable integrated filter.

5. The filter in accordance with claim 4 wherein said master comprises a voltage-controlled oscillator for generating said second reference signal and said disable signal further deactivates or disables said voltage-controlled oscillator.

6. The filter in accordance with claim 4 wherein said master comprises a voltage-controlled filter for generating said second reference signal in response to said first reference signal.

7. The filter in accordance with claim 4 further comprising a first external adjustment means for varying said frequency control signal in response to an adjustment signal.

8. The filter in accordance with claim 1 further comprising:
  means for generating a Q-control signal in response to said first reference signal; and
  second means for sampling and holding at one or more predetermined times said Q-control signal and outputting said Q-control signal during said time period when said first reference signal is quiescent, said Q-control signal tuning frequency characteristics of said first tunable integrated filter.

9. The filter in accordance with claim 2 further comprising:
  a Q-control circuit for generating a Q-control signal in response to said first reference signal and said second reference signal; and
  second means for sampling and holding at one or more predetermined times said Q-control signal and outputting said Q-control signal during a time period when said first reference signal is quiescent, said Q-control signal tuning frequency characteristics of said first tunable integrated filter.

10. The filter in accordance with claim 9 wherein said first means for sampling and holding comprises a first sample-and-hold circuit for sampling and holding said frequency control signal in response to a first hold signal, and said second means for sampling and holding comprises a first sample-and-hold circuit for sampling and holding said Q-control signal in response to a second hold signal.

11. The filter in accordance with claim 10 further comprising means for generating said first hold signal and said second hold signal at a predetermined time and generating a disable signal for disabling said first reference signal for a predetermined period of time to reduce noise from said first reference signal from feeding through to said tunable integrated filter.

12. A self-tuned filter integrated on a chip comprising:
  an integrated slave filter;
  an integrated master outputting a first reference signal;
  a frequency control circuit comprising circuitry for receiving said first reference signal and a second reference signal and generating a master frequency control signal relating to difference in phase or frequency between said first reference signal and said second reference signal;
  a first sample and hold circuit receiving and sampling said master frequency control signal and outputting a frequency control signal during a time period when said second reference signal is quiescent, said frequency control signal for controlling filter frequency characteristics of said slave filter.

13. The filter in accordance with claim 12 further comprising:
  a Q-control circuit comprising circuitry for receiving said first reference signal and said second reference signal and generating a master Q-control signal relating to said difference in amplitude between said first reference signal and said second reference signal;
  a second sample and hold circuit receiving and sampling said master Q-control signal and outputting a Q-control signal during a time period when said second reference signal is quiescent, said Q-control signal for controlling filter frequency characteristics of said slave filter.

14. The filter in accordance with claim 13 further comprising:
  circuitry for disabling said second reference signal in response to a disable signal; and
  circuitry for generating said disable signal and a hold signal for activating said first sample-and-hold circuit and said second sample-and-hold circuit.

15. The filter in accordance with claim 14 further comprising an external adjustment circuit for independently adjusting said frequency control signal and said Q-control signal in response to one or more adjustment signals.

16. The filter in accordance with claim 14 wherein said master comprises a voltage-controlled oscillator for generating said second reference signal and said disable signal further disables said voltage-controlled oscillator.

17. A method for reducing noise in a self-tuned filter integrated on a chip, comprising the steps of:

providing a first tunable filter integrated on the chip;

generating a frequency control signal in response to a first reference signal;

sampling and holding at one or more predetermined times said frequency control signal and outputting said frequency control signal during a time period when said first reference signal is quiescent; and tuning frequency characteristics of said first tunable filter in response to said frequency control signal.

18. The method in accordance with claim 17 further comprising the steps of:

generating and outputting a second reference signal from a master, said master substantially modeling performance criteria of said first tunable integrated filter;

detecting phase or frequency difference between said first reference signal and said second reference signal; and generating said frequency control signal in response to said detected phase or frequency difference.

19. The method in accordance with claim 18 further comprising the steps of:

detecting amplitude difference between said first reference signal and said second reference signal;

generating a Q-control signal in response to said detected amplitude difference;

sampling and holding at one or more predetermined times said Q-control signal and outputting said Q-control signal during a time period when said first reference signal is quiescent; and tuning frequency characteristics of said first tunable filter in response to said Q-control signal.

20. The method in accordance with claim 19 further comprising the step of disabling the first reference signal for said time period.

* * * * *